(12) United States Patent
Gidney

(10) Patent No.: US 12,288,130 B2
(45) Date of Patent: Apr. 29, 2025

(54) METHODS AND APPARATUS FOR PERFORMING PHASE OPERATIONS

(71) Applicant: Google LLC, Mountain View, CA (US)

(72) Inventor: Craig Gidney, Goleta, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/586,154

(22) Filed: Feb. 23, 2024

(65) Prior Publication Data

US 2024/0232673 A1 Jul. 11, 2024

Related U.S. Application Data

(63) Continuation of application No. 18/181,419, filed on Mar. 9, 2023, now Pat. No. 11,941,488, which is a continuation of application No. 16/753,699, filed as application No. PCT/US2019/027640 on Apr. 16, 2019, now Pat. No. 11,625,637.

(Continued)

(51) Int. Cl.
 *G06N 10/20* (2022.01)
 *G06N 10/40* (2022.01)
 *H03K 19/20* (2006.01)

(52) U.S. Cl.
 CPC .......... *G06N 10/20* (2022.01); *G06N 10/40* (2022.01); *H03K 19/20* (2013.01)

(58) Field of Classification Search
 None
 See application file for complete search history.

(56) References Cited

U.S. PATENT DOCUMENTS

2003/0164490 A1 9/2003 Blais
2008/0310000 A1 12/2008 Beausoleil et al.
(Continued)

FOREIGN PATENT DOCUMENTS

| CN | 101118608 | 2/2008 |
| JP | 2016-500886 | 1/2016 |
| WO | WO 2019050555 | 3/2019 |

OTHER PUBLICATIONS

Barends et al. "Superconducting quantum circuits at the surface code threshold for fault tolerance," Nature, Apr. 24, 2014, 15 pages.
(Continued)

*Primary Examiner* — Jany Richardson
(74) *Attorney, Agent, or Firm* — Fish & Richardson P.C.

(57) ABSTRACT

Methods, systems, and apparatus for performing phase operations. In one aspect, a method for performing a same phase operation on a first and second qubit using a third qubit prepared in a phased plus state includes: performing a first NOT operation on the third qubit; computing a controlled adder operation on the first, second and third qubit, comprising encoding the result of the controlled adder operation in a fourth qubit; performing a square of the phase operation on the fourth qubit; uncomputing the controlled adder operation on the first, second and third qubit; performing a CNOT operation between the first qubit and the third qubit, wherein the first qubit acts as the control; performing a CNOT operation between the second qubit and the third qubit, wherein the second qubit acts as the control; and performing a second NOT operation on the third qubit.

20 Claims, 12 Drawing Sheets

Related U.S. Application Data

(60) Provisional application No. 62/658,993, filed on Apr. 17, 2018.

(56) References Cited

U.S. PATENT DOCUMENTS

| | | | |
|---|---|---|---|
| 2014/0118024 A1 | 5/2014 | Eastin | |
| 2016/0142057 A1 | 5/2016 | Melton et al. | |
| 2017/0351967 A1 | 12/2017 | Babbush et al. | |
| 2018/0053112 A1* | 2/2018 | Bravyi | G06N 10/40 |
| 2020/0311594 A1* | 10/2020 | Gidney | G06F 17/10 |
| 2022/0067567 A1* | 3/2022 | O'Brien | G06N 10/40 |

OTHER PUBLICATIONS

Bravyi et al., "Universal Quantum Computation with ideal Clifford gates and noisy ancillas" CoRR, submitted on Dec. 16, 2004, arXiv:quant-ph/0403025v2, 14 pages.
Garcia-Escartin et al., "Equivalent Quantum Circuits," CoRR, submitted on Oct. 13, 2011, arXiv:1110.2998v1, 12 pages.
Gidney, "Halving the cost of quantum addition," CoRR, submitted on Jan. 19, 2018, arXiv 1709.06648v2, 5 pages.
Gidney, "Proxy Phasing and Computed Phasing," Algorithmic Assertions, 2017, 8 pages.
International Preliminary Report on Patentability in International Appln. No. PCT/US2019/027640, mailed on Oct. 29, 2020, 11 pages.
International Search Report and Written Opinion issued in International Appln. No. PCT/US2019/027640, mailed on Jul. 31, 2019, 17 pages.
Kivlichan et al. "Improved Fault-Tolerant Quantum Simulation of Condensed-Phase Correlated Electrons via Trotterization," arXiv 1902.10673v1, Feb. 27, 2019, 35 pages.
Notice of Allowance in Australian Appln. No. 2022201377, mailed on Sep. 21, 2023, 3 pages.
Office Action in Australian Appln. No. 2022201377, mailed on Feb. 23, 2023, 3 pages.
Office Action in Australian Appln. No. 2019255217, mailed on Jan. 4, 2021, 3 pages.
Office Action in Australian Appln. No. 2019255217, mailed on Oct. 15, 2020, 4 pages.
Office Action in Canadian Appln. No. 3,080,180, mailed on Jun. 30, 2023, 5 pages.
Office Action in Canadian Appln. No. 3,080,180, mailed on Jun. 7, 2021, 3 pages.
Office Action in Chinese Appln. No. 201980005351.2, mailed on Apr. 8, 2023, 12 pages (with English translation).
Office Action in European Appln. No. 19721473.7, mailed on Oct. 13, 2021, 13 pages.
Office Action in European Appln. No. 19721473.7, mailed on Apr. 17, 2024, 12 pages.
Office Action in Japanese Appln. No. 2021-130663, mailed on Sep. 5, 2022, 5 pages (with English Translation).
Oliveira et al., "A probabilistic CNOT gate for coherent state qubits,", Physics Letters A, Nov. 22, 2013, 377(39):2821-2825.
Paetznick, "Resource optimization for fault-tolerant quantum computing," Thesis for PhD in Computer Science at University of Waterloo, Dec. 13, 2013, 116 pages.

\* cited by examiner

METHODS AND APPARATUS FOR PERFORMING PHASE OPERATIONS

CROSS-REFERENCE TO RELATED APPLICATIONS

This application is a continuation application of, and claims priority to, U.S. patent application Ser. No. 18/181,419, filed on Mar. 9, 2023, which application is a continuation application of, and claims priority to, U.S. patent application Ser. No. 16/753,699, now U.S. Pat. No. 11,625,637, filed on Apr. 3, 2020, which application is a National Stage Application under 35 U.S.C. § 371 and claims the benefit of International Application No. PCT/US2019/027640, filed Apr. 16, 2019, which claims the benefit under 35 U.S.C. § 119(e) of priority to U.S. Application No. 62/658,993, filed Apr. 17, 2018, the entire disclosures of each are incorporated herein by reference.

BACKGROUND

This specification relates to quantum computing.

One example model for quantum computation is the quantum circuit model. In the quantum circuit model, a computation is a sequence of quantum gates—reversible transformations on a quantum mechanical analog of an n-bit register. This analogous structure is referred to as an n-qubit register. Example quantum gates include single qubit gates such as the Hadamard gate, Pauli X gate, Pauli Y gate, and Pauli Z gate, and multi qubit gates such as the SWAP gate or controlled X, Y or Z gates.

SUMMARY

This specification describes technologies for performing phase operations in quantum circuits.

One innovative aspect of the subject matter described in this specification can be implemented in a method and construction for performing a same phase operation on a first and second qubit using a third qubit prepared in a phased plus state, the method comprising: performing a first NOT operation on the third qubit; computing a controlled adder operation on the first, second and third qubit, comprising encoding the result of the controlled adder operation in a fourth qubit; performing a square of the phase operation on the fourth qubit; uncomputing the controlled adder operation on the first, second and third qubit; performing a CNOT operation between the first qubit and the third qubit, wherein the first qubit acts as the control; performing a CNOT operation between the second qubit and the third qubit, wherein the second qubit acts as the control; and performing a second NOT operation on the third qubit. The method may be performed by a quantum computing device comprising the first, second, third and fourth qubits.

Other implementations of this aspect include corresponding classical and/or quantum computer systems, apparatus, and computer programs recorded on one or more computer storage devices, each configured to perform the actions of the methods. A system of one or more classical or quantum computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations computing the controlled adder operation comprises: performing a multi target CNOT on the first, second and third qubit, wherein the first qubit acts as the control; computing a logical AND operation between the second and third qubit; encoding the result of the logical AND computation in the fourth qubit; and performing a CNOT operation between the first qubit and the fourth qubit, wherein the first qubit acts as the control.

In some implementations uncomputing the controlled adder operation comprises: performing a CNOT operation on the first qubit and the fourth qubit, wherein the first qubit acts as the control; un-computing a logical AND operation between the second and third qubit; and performing a multi target CNOT operation on the first, second and third qubit, wherein the first qubit acts as the control.

In some implementations uncomputing the controlled adder operation on the first, second and third qubit; performing a CNOT operation between the first qubit and the third qubit, wherein the first qubit acts as the control; performing a CNOT operation between the second qubit and the third qubit, wherein the second qubit acts as the control, comprises: performing a CNOT operation on the first qubit and the fourth qubit, wherein the first qubit acts as the control; un-computing a logical AND operation between the second and third qubit; and performing a CNOT operation on the second qubit and the third qubit, wherein the second qubit acts as the control; and performing a multi target CNOT operation on the first, second and third qubit, wherein the first qubit acts as the control.

In some implementations performing the second NOT operation on the third qubit returns the third qubit to the phased plus state.

In some implementations the first and second qubits are initially prepared in arbitrary initial states.

Another innovative aspect of the subject matter described in this specification can be implemented in a method and construction for preparing a second qubit in a same state as a third qubit when performing a phase operation on a first qubit, wherein the first qubit is prepared in an arbitrary initial state, the second qubit is prepared in a plus state, and the third qubit is prepared in a phased plus state, the method comprising: performing a first NOT operation on the third qubit; computing a controlled adder operation on the first, second and third qubit, comprising encoding the result of the controlled adder operation in a fourth qubit; performing a square of the phase operation on the fourth qubit; uncomputing the controlled adder operation on the first, second and third qubit; performing a CNOT operation between the first qubit and the third qubit, wherein the first qubit acts as the control; performing a CNOT operation between the second qubit and the third qubit, wherein the second qubit acts as the control; and performing a second NOT operation on the third qubit.

Other implementations of this aspect include corresponding classical or quantum computer systems, apparatus, and computer programs recorded on one or more computer storage devices, each configured to perform the actions of the methods. A system of one or more classical or quantum computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations computing the controlled adder operation comprises: performing a multi target CNOT on the first, second and third qubit, wherein the first qubit acts as the control; computing a logical AND operation between the second and third qubit; encoding the result of the logical AND computation in the fourth qubit; and performing a CNOT operation between the first qubit and the fourth qubit, wherein the first qubit acts as the control.

In some implementations uncomputing the controlled adder operation comprises: performing a CNOT operation on the first qubit and the fourth qubit, wherein the first qubit acts as the control; un-computing a logical AND operation between the second and third qubit; performing a CNOT operation between the second and third qubit, wherein the second qubit acts as the control; and performing a multi target CNOT operation on the first, second and third qubit, wherein the first qubit acts as the control.

In some implementations uncomputing the controlled adder operation on the first, second and third qubit; performing a CNOT operation between the first qubit and the third qubit, wherein the first qubit acts as the control; performing a CNOT operation between the second qubit and the third qubit, wherein the second qubit acts as the control, comprises: performing a CNOT operation on the first qubit and the fourth qubit, wherein the first qubit acts as the control; un-computing a logical AND operation between the second and third qubit; and performing a CNOT operation on the second qubit and the third qubit, wherein the second qubit acts as the control; and performing a multi target CNOT operation on the first, second and third qubit, wherein the first qubit acts as the control.

In some implementations uncomputing the controlled adder operation on the first, second and third qubit; performing a CNOT operation between the first qubit and the third qubit, wherein the first qubit acts as the control; performing a CNOT operation between the second qubit and the third qubit, wherein the second qubit acts as the control; and performing a second NOT operation on the third qubit returns the third qubit to the phased plus state and prepares the second qubit in a phased plus state.

In some implementations the method further comprises providing the second qubit prepared in the phased plus state for use in a gate teleportation operation.

In some implementations a gate teleportation operation comprises: a same phase operation on a fifth and sixth qubit; preparing a sixth qubit in a same state as a seventh qubit when performing a phase operation on a fifth qubit; or performing the phase operation on a fifth qubit.

In some implementations performing the phase operation on a fifth qubit comprises: applying a CNOT operation between the second qubit prepared in the phased plus state and the fifth qubit prepared in an arbitrary state, wherein the fifth qubit acts as the control; measuring the second qubit; and applying a squared phase operation to the fifth qubit if a generated measurement result from measuring the second qubit indicates that the second qubit is ON.

In some implementations performing a square of the phase operation on the fourth qubit comprises performing the method of 6 to prepare a sixth qubit in a same state as a seventh qubit when performing the square of the phase operation on a fifth qubit.

In some implementations the method further comprises iteratively performing squares of the phase operation to perform a $(Z^\theta)^{2^n}$ phase operation at an n-th iteration, amortizing costs over groups of operations, determining the Hamming weight of produced states.

In some implementations the method further comprises, for a system requiring N phase operations to be performed on multiple respective qubits: grouping qubits that require a same phase operation into O(sqrt(N)) groups of size O(sqrt (N)); preparing a full-total qubit register of size O(log(N)); for each group: computing a Hamming weight of the qubits in the group; adding a computed group-total into the full-total register; uncompute the Hamming weight of the qubits in the group; performing phase operations on the full-total register; for each group: computing a Hamming weight of the qubits in the group; subtracting a computed group-total out of the full-total register; and uncomputing the Hamming weight of the qubits in the group. In some implementations the full total register may be cleared and discarded.

The same phase operation may include a single qubit operation of the form $$Z^\theta = \begin{pmatrix} 1 & 0 \\ 0 & e^{i\pi\theta} \end{pmatrix}$$

where $\theta$ specifies the phase operation, and wherein the square of the phase operation is given by $Z^{2\theta}$. A phased plus state may include the desired phase operation applied to a plus state $|+\rangle = (|0\rangle + |1\rangle)/\sqrt{2}$. The phase operation may be a $\sqrt{T} = Z^{\pi/8}$ operation.

Details of one or more implementations of the subject matter of this specification are set forth in the accompanying drawings and the description below. Other features, aspects, and advantages of the subject matter will become apparent from the description, the drawings, and the claims.

DETAILED DESCRIPTION

Overview

Phase operations $Z^\theta$ are single-qubit gates that leave the basis state $|0\rangle$ unchanged and map the basis state $|1\rangle$ to $e^{i\pi\theta}|1\rangle$, where $\theta$ represents a phase shift:

$$Z^\theta = \begin{pmatrix} 1 & 0 \\ 0 & e^{i\pi\theta} \end{pmatrix}.$$

The probability of measuring a $|0\rangle$ or $|1\rangle$ after application of a phase operation does not change, but the phase of the quantum state is shifted.

Phase operations are common operations in quantum circuits. Phasing by 180 degrees (Z gates) or 90 degrees (S gates) is relatively straightforward to implement and has low cost. Phasing by 45 degrees (T gates) has increased cost. Furthermore, phasing by angles that are not multiples of 45 degrees is even more costly, since such phase operations typically require approximating the target operation with T gates, and the number of T gates required to obtain a good approximation of a target phase angle increases as the target precision becomes more exact. For example, in some cases performing a non-45-degree phasing operation may require up to 50 T gates.

This specification describes various techniques for reducing the number of T gates required for performing phase operations $Z^\theta$. The techniques include using addition operations to merge phasing operations, e.g., performing two $\sqrt{T}$ gates using five T gates, duplicating states when performing phase operations, and performing individual $\sqrt{T}$, $\sqrt{\sqrt{T}}$ or more generally $(T)^{2^{-n}}$ gates with reduced T count.

Example Hardware

Figure 1:
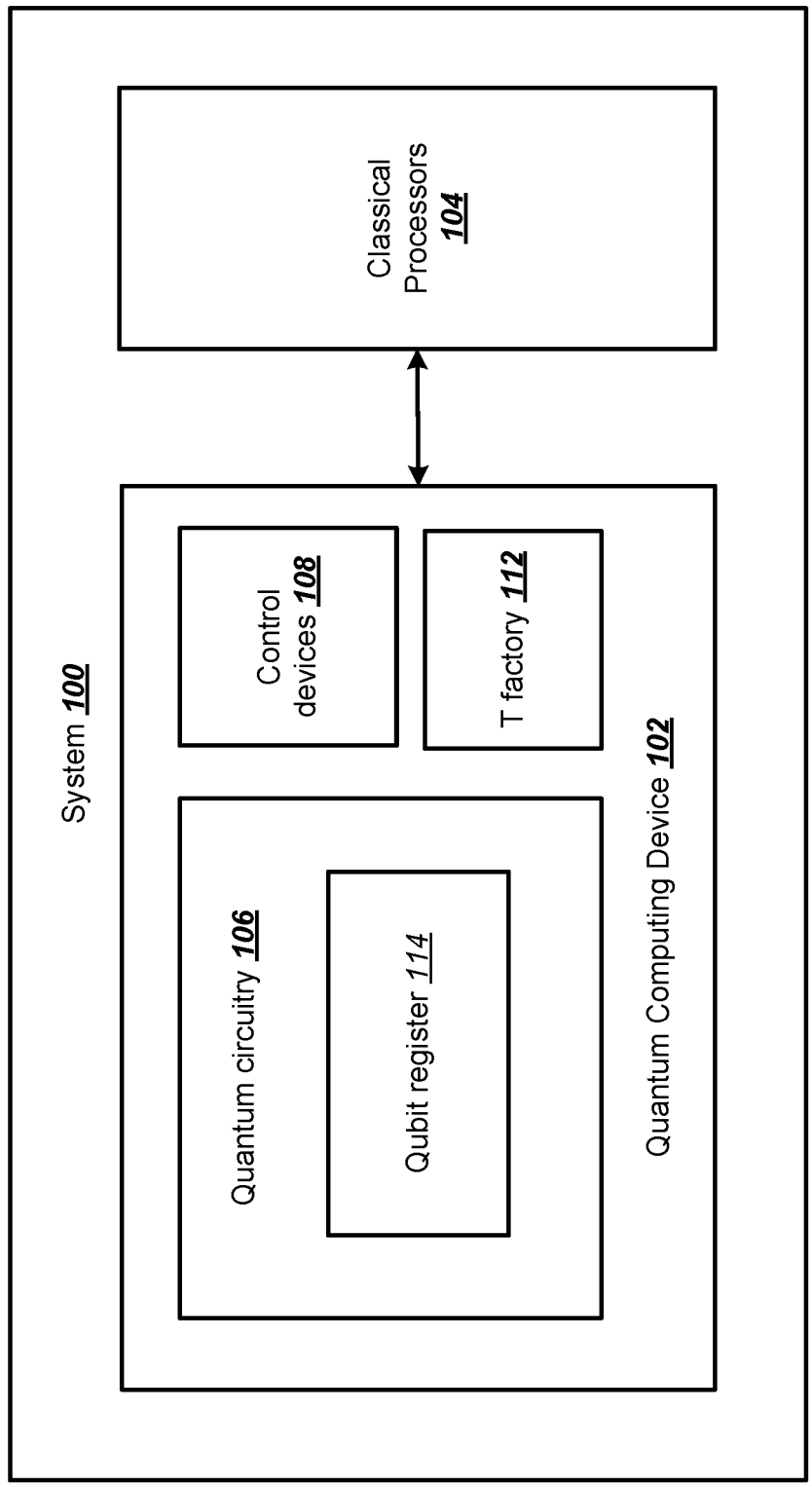
FIG. 1 shows an example system for performing phase operations.

FIG. 1 depicts an exemplary system 100 for performing phase operations. The system 100 is an example of a system implemented as quantum and/or classical computer programs on one or more quantum computing devices and/or classical computers in one or more locations, in which the systems, components, and techniques described below can be implemented.

The system 100 includes a quantum computing device 102 in data communication with one or more classical processors 104. For convenience, the quantum computing device 102 and classical processors 104 are illustrated as separate entities, however in some implementations the one or more classical processors may be included in quantum computing device 102.

The quantum computing device 102 includes components for performing quantum computation. For example, the quantum computing device 102 includes at least quantum circuitry 106 and control devices 108.

The quantum circuitry 106 includes components for performing quantum computations, e.g., components for implementing the various quantum circuits and operations described below with reference to FIGS. 2-11. For example, the quantum circuitry may include a quantum system that includes one or more multi-level quantum subsystems, e.g., a register of qubits 114. The type of multi-level quantum subsystems that the system 100 utilizes may vary. For example, in some implementations the multi-level quantum subsystems may be superconducting qubits, e.g., Gmon or Xmon qubits. In some cases it may be convenient to include one or more resonators attached to one or more superconducting qubits. In other cases ion traps, photonic devices or superconducting cavities (with which states may be prepared without requiring qubits) may be used. Further examples of realizations of multi-level quantum subsystems include fluxmon qubits, silicon quantum dots or phosphorus impurity qubits.

Quantum circuits comprising different quantum logic operations, e.g., single qubit gates, two qubit gates, and three qubit gates such as the NOT gates, CNOT gates, multi target CNOT gates, and logical AND operations described below with reference to FIGS. 2-11, may be constructed using the quantum circuitry 106. Constructed quantum circuits can be operated/implemented using the control devices 108. The type of control devices 108 included in the quantum system depend on the type of qubits included in the quantum computing device. For example, in some cases the control devices 108 may include devices that control the frequencies of qubits included in the quantum circuitry 106, an excitation pulse generator and control lines that couple the qubits to the excitation pulse generator. The control devices may then cause the frequency of each qubit to be adjusted towards or away from a quantum gate frequency of an excitation pulse on a corresponding control driveline. The control devices 108 may further include measurement devices, e.g., readout resonators. Measurement results obtained via measurement devices may be provided to the classical processors 104 for processing and analyzing.

The quantum computing device 102 may include one or more quantum state factories, e.g., T factory 112, for producing quantum states that may be consumed by the quantum circuitry when performing quantum computations. For example, as described below with reference to FIGS. 2 and 4, the T factory 112 may produce T states or $\sqrt{T}$ states and provide the produced states to the quantum circuitry 106.

Figure 2:
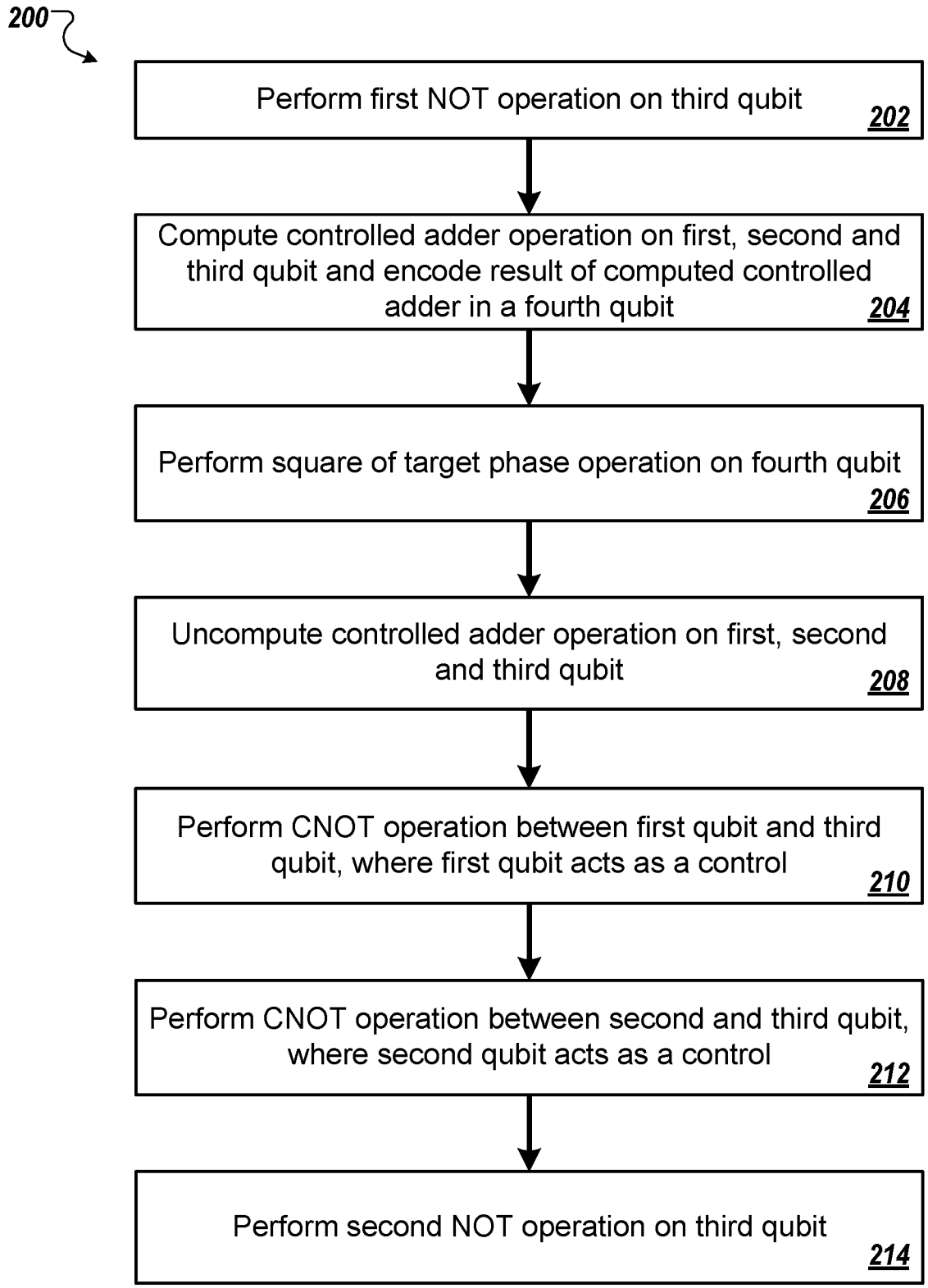
FIG. 2 is a flow diagram of an example process for performing a target phase operation on a first qubit and second qubit using a third qubit prepared in a phased plus state.

Operating the Hardware: An Example Method for Merging Two Target Phase Operations Using Addition FIG. 2 is a flowchart of an example process 200 for performing a target phase operation $Z^\theta$ on both a first qubit prepared in a first input state and a second qubit prepared in a second input state using a third qubit prepared in a phased plus state $Z^\theta|+\rangle$. The phased plus state specialized to the target angle of the target phase operation can be created using any of multiple existing techniques. For convenience, the process 200 will be described as being performed by a system of one or more classical or quantum computing devices located in one or more locations. For example, a quantum computation system, e.g., the system 100 of FIG. 1, appropriately programmed in accordance with this specification, can perform the process 200.

The system performs a first NOT operation on the third qubit (step 202).

The system performs a controlled adder operation on the first, second and third qubit, which includes encoding the result of the controlled adder operation in a fourth qubit (step 204). As shown in the example quantum circuit 300 described below with reference to FIG. 3A, computing the controlled adder operation on the first, second and third qubit may include performing a multi target CNOT operation on the first, second and third qubit, where the first qubit acts as a control for the multi target CNOT operation, computing a logical AND operation between the second and third qubit and encoding the result of the logical AND computation in the fourth qubit, and performing a CNOT operation between the first qubit and the fourth qubit, where the first qubit acts as a control for the CNOT operation. Example methods for computing and uncomputing logical AND operations are described in detail in "Quantum circuits with reduced T gate count," WO 2019/050555.

The system performs a square of the target phase operation $(Z^\theta)^2 = Z^{2\theta}$ on the fourth qubit (step 206). This inner phasing operation that phases by twice as much as the target angle may be implemented in several possible ways. Example implementations include applying existing techniques such as repeat-until-success techniques, using a T gate (if the doubled angle is a multiple of 45 degrees), or recursively, by the same process used to perform the phasing operation by the desired angle (up to some maximum depth).

The system un-computes the controlled adder operation on the first, second and third qubit (step 208). Un-computing the controlled adder operation may include performing a CNOT operation on the first qubit and the fourth qubit, where the first qubit acts as a control for the CNOT operation, un-computing the logical AND operation described above with reference to step 204, and performing a multi target CNOT operation on the first, second and third qubit, where the first qubit acts as a control for the multi-target CNOT operation.

The system performs a CNOT operation between the first qubit and the third qubit, where the first qubit acts as a control for the CNOT operation (step 210).

The system performs a CNOT operation between the second qubit and the third qubit, where the second qubit acts as a control for the CNOT operation (step 212).

The system performs a second NOT operation on the third qubit (step 214).

Figure 3A:
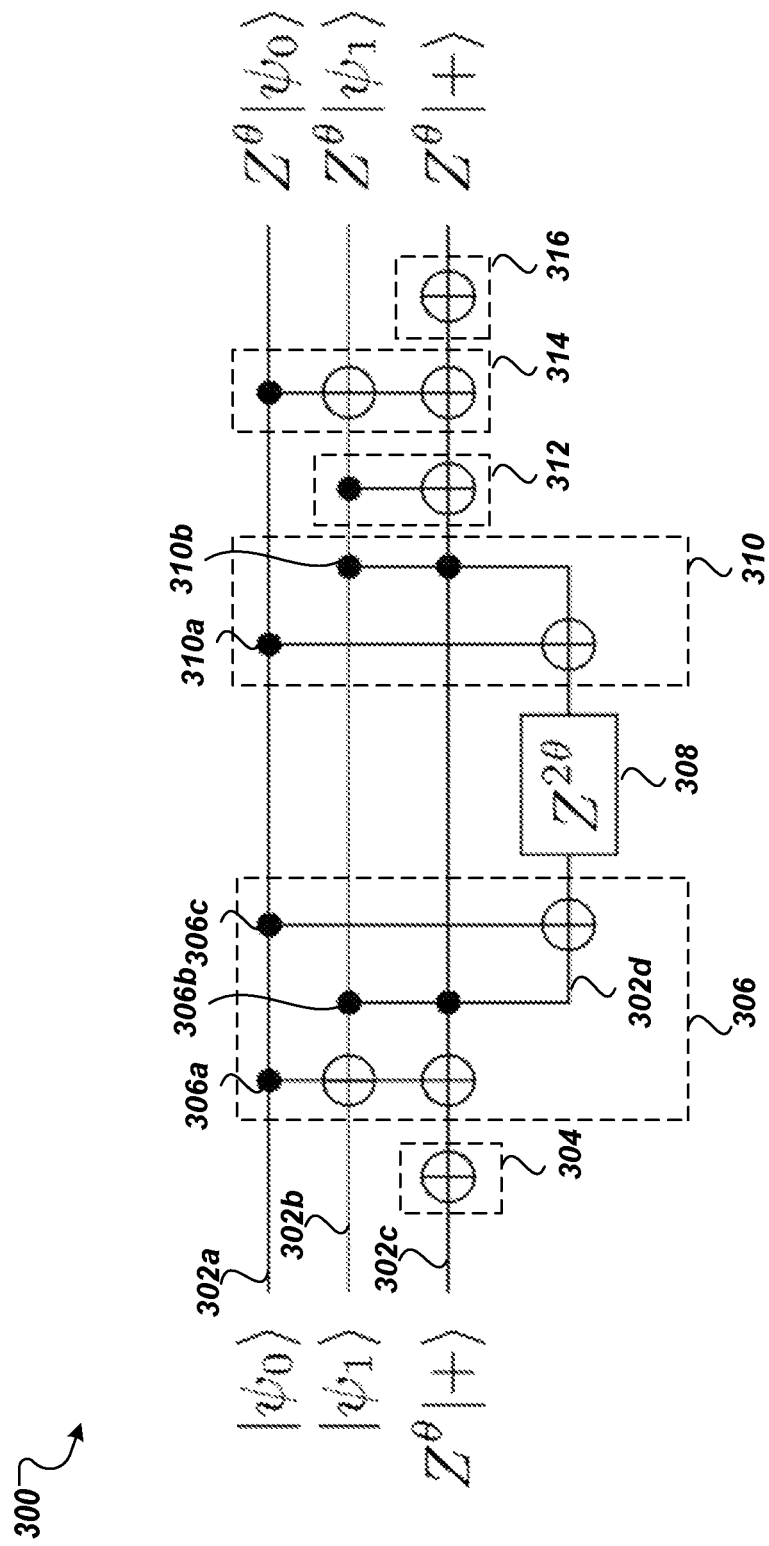
FIG. 3A is a circuit diagram of an example quantum circuit for performing a target phase operation on a first and second qubit using a third qubit prepared in a phased plus state.

In some implementations, steps 208-212 may be replaced by the following steps: performing a CNOT operation on the first qubit and the fourth qubit, where the first qubit acts as a control for the CNOT operation, un-computing the logical AND operation between the second and third qubit, performing a CNOT operation on the second qubit and the third qubit, where the second qubit acts as a control for the CNOT operation, and performing a multi target CNOT operation on the first, second and third qubit, where the first qubit acts as a control for the multi target CNOT operation, as shown in the example quantum circuit 300 described below with reference to FIG. 3A.

Once the second NOT operation has been performed on the third qubit, the target phase operation has been applied to the first input state and to the second input state. The third qubit returns to its initial state—the phased plus state. One or more of these output states can then be provided for use in subsequent computations, as described in more detail below.

In some implementations a quantum circuit may include multiple applications of a phase operation to different qubits, e.g., three or more applications of a same phase operation to different qubits. In these implementations Hamming weight phasing may be applied to merge the identical phase operations into a smaller number of different phase operations.

For example, consider a quantum circuit where a same phasing operation $Z^\theta$ is simultaneously applied to three different qubits. The action on the logical states of the three qubits is a different phase, depending only on the Hamming weight of that logical state. That is, the all-zero state 000 picks up the phase $-3\theta/2$, the three states of Hamming weight one 001, 010, and 100 each pick up a phase $-\theta/2$, the three states of Hamming weight two 011, 101, and 110 are all phased by $\theta/2$, and the all-one state 111 picks up a phase $3\theta/2$.

Rather than applying three rotations by the same angle $\theta$, the Hamming weight of the input states can be computed, and 2 distinct rotations can be applied to the Hamming weight: $\theta$ to the 1 s bit, and $2\theta$ to the 2 s bit. In this case, the phase $$-\frac{3\theta}{2}$$

is applied to the all-zero state 000 (Hamming weight 0), $$-\frac{\theta}{2} = -\theta + \frac{\theta}{2}$$

is applied to 001, 010, and 100 (Hamming weight $1=01_b$ in binary), $$\frac{\theta}{2} = \theta - \frac{\theta}{2}$$

is applied to 011, 101, and 110 (Hamming weight $2=10_b$), and $$\frac{3\theta}{2} = \theta + \frac{\theta}{2}$$

is applied to the all-one state 111 (Hamming weight $3=11_b$). The phases on each logical state are identical for the two procedures. However, because arbitrary rotations must be synthesized using costly T gates, reducing the number of arbitrary rotation gates in the circuit reduces its fault-tolerant cost.

This concept can be extended to the case of n repeated equiangular rotations appearing in parallel in a circuit: rather than applying the n original arbitrary rotations, the Hamming weight of the relevant qubits can be computed, and instead $\lfloor \log_2 n+1 \rfloor$ arbitrary rotations $\theta, 2\theta, 4\theta, \ldots$ can be applied to the Hamming weight. This technique is called Hamming weight phasing.

Hamming weight phasing can appear to give an improvement for free. However, there are two primary sources of cost—an additional number of T gates and an ancilla qubit requirement, both arising from the use of adder circuits (circuits that include the above described logical AND computations and uncomputations) when computing the Hamming weight. However, by computing the Hamming weight of size $\lfloor \sqrt{n} \rfloor$ subsets of qubits at a time and summing these subset Hamming weights, rather than directly computing the full Hamming weight, the number of required ancilla qubits can be reduced from $n-1$ to $\lfloor \sqrt{n} \rfloor + \lfloor \log_2 n \rfloor$ or even to $2 \log_2 n$.

For example, the system can group the n phase operations (or equivalently, n qubits on which the n phase operations are to be performed) into multiple groups of size $\lfloor \sqrt{n} \rfloor$ and prepare a full-total qubit register of size $\lfloor \log_2 n \rfloor$. For each group, the system computes a Hamming weight of the qubits in the group using $\lfloor \sqrt{n}-1 \rfloor$ ancilla qubits, and adds a computed group-total into the prepared full-total qubit register. The system then uncomputes the Hamming weight of the qubits in the group. The same $\lfloor\sqrt{n}-1\rfloor$ ancilla qubits can be used to compute the Hamming weight of each group. After the Hamming weight of all $\lfloor n/\sqrt{n}\rfloor$ groups has been computed and added to the total, phase operations can be applied to the total Hamming weight in the full-total register as described above. Then, for each group, the system re-computes the Hamming weight of the qubits in the group and subtracts a computed group total out of the full total register to uncompute the full total Hamming weight register. This reduces the number of ancilla qubits required from n−1 to $\lfloor\sqrt{n}\rfloor+\lfloor\log_2 n\rfloor$. The number of ancilla qubits is reduced at the cost of requiring more T gates, however the number of T gates required to reduce the original n phase operations to $\lfloor\log_2 n+1\rfloor$ phase operations is approximately upper bounded by $8n+\sqrt{n}\log_2 n+12\log_2 n-8$, which is only slightly more than existing applications of Hamming weight phasing methods that require 4n−4 T gates but significantly more (i.e., n) ancilla qubits.

Further reductions can also be achieved by dividing the n phase operations into $n/\log_2 n$ groups each of size $\log_2 n$. For each of these groups the system can compute the Hamming weight of the qubits in the group, add this weight into an accumulator register full total qubit register), then uncompute the Hamming weight of the qubits in the group. The accumulator register then contains the Hamming weight of the entire set of qubits. Phase operations can be applied to the total Hamming weight in the accumulator register as described above. Then, for each group, the system performs a reverse of the computation process, e.g., the system re-computes the Hamming weight of the qubits in the group and subtracts a computed group total out of the accumulator register to uncompute the full total Hamming weight register. This doubles the number of addition operations that must be performed, but reduces the space requirements to $2\log_2 n$.

FIGS. 3-10 show various applications of example process 200 and Hamming weight phasing. For example, FIG. 3A is a circuit diagram 300 of an example quantum circuit for performing a target phase operation $Z^\theta$ on a first and second qubit using a third qubit prepared in a phased plus state $Z^\theta|+\rangle$.

In the example quantum circuit shown in circuit diagram 300, the first qubit, second qubit and third qubit are represented by horizontal lines 302a-c. In the example quantum circuit 300, qubits 302a and 302b represent the first and second qubit on which the target phase operation $Z^\theta$ is to be performed. Qubits 302a and 302b are provided to the example quantum circuit 300 in input states $|\psi_0\rangle$ and $|\psi_1\rangle$, respectively. The input states $|\psi_0\rangle$ and $|\psi_1\rangle$ can be initial states of either of the qubits 302a or 302b, i.e., qubits 302a or 302b may have been prepared in arbitrary initial states, or can be states representing an output of a previous computation. Qubit 302c represents the third qubit that is prepared in a phased plus state $Z^\theta|+\rangle$. The qubit 302c can be prepared in the phased plus state using any one of existing techniques.

The example quantum circuit 300 includes a sequence of gates that are applied to the qubits 302a-302c. The sequence of gates includes a first NOT operation 304 that is applied to the third qubit 302c. A first collection of operations 306 are then applied to the qubits 302a-302c to compute a controlled adder operation on the qubits 302a-302c. The first collection of operations 306 includes a multi target CNOT gate 306a that is applied to the three qubits 302a-302c, where the first qubit acts as a control for the multi target CNOT gate. The first collection of operations 306 further includes a logical AND operation 306b that is performed between the second and third qubit. The result of the local AND operation is encoded in a fourth qubit 302d. The first collection of operations 306 further includes a CNOT gate 306c that is applied to the first qubit 302a and the fourth qubit 302d, where the first qubit 302a acts as a control for the CNOT gate.

The sequence of gates further includes a square of the target phase operation 308 that is applied to the fourth qubit 302d. A second collection of operations 310 is then applied to the qubits 302a-302d to uncompute the controlled adder operation performed by the first collection of operations 306. The second collection of operations 310 includes a CNOT operation 310a that is applied to the first qubit 302a and to the fourth qubit 302d, where the first qubit 302a acts as a control for the CNOT operation 310a. The second collection of operations 310 further includes the uncomputation of a logical AND operation 310b between the second qubit 302b and the third qubit 302c.

The sequence of gates further includes a CNOT operation 312 that is applied to the second qubit 302b and the third qubit 302c, where the second qubit 302b acts as a control for the CNOT operation 312. The sequence of gates further includes a multi target CNOT operation 314 that is applied to the first qubit 302a, second qubit 302b and third qubit 302c, where the first qubit 302a acts as a control for the multi target CNOT operation 314. The sequence of gates includes a NOT operation 316 that is applied to the third qubit 302c. The NOT operation 316 returns the qubit to the original phased plus state $Z^\theta|+\rangle$.

After the example quantum circuit has been applied to the three qubits 302a-c (and fourth qubit 302d), the target phase operation $Z^\theta$ has been applied to the first qubit 302a and second qubit 302b. That is, the example quantum circuit 300 operates on a resource state—a $|+\rangle$ state that has been phased by an angle equivalent to the target phase operation's angle—and ) two input states that are to be phased by the angle, phases the two inputs states in the target way, and returns the resource state.

Figure 3B:
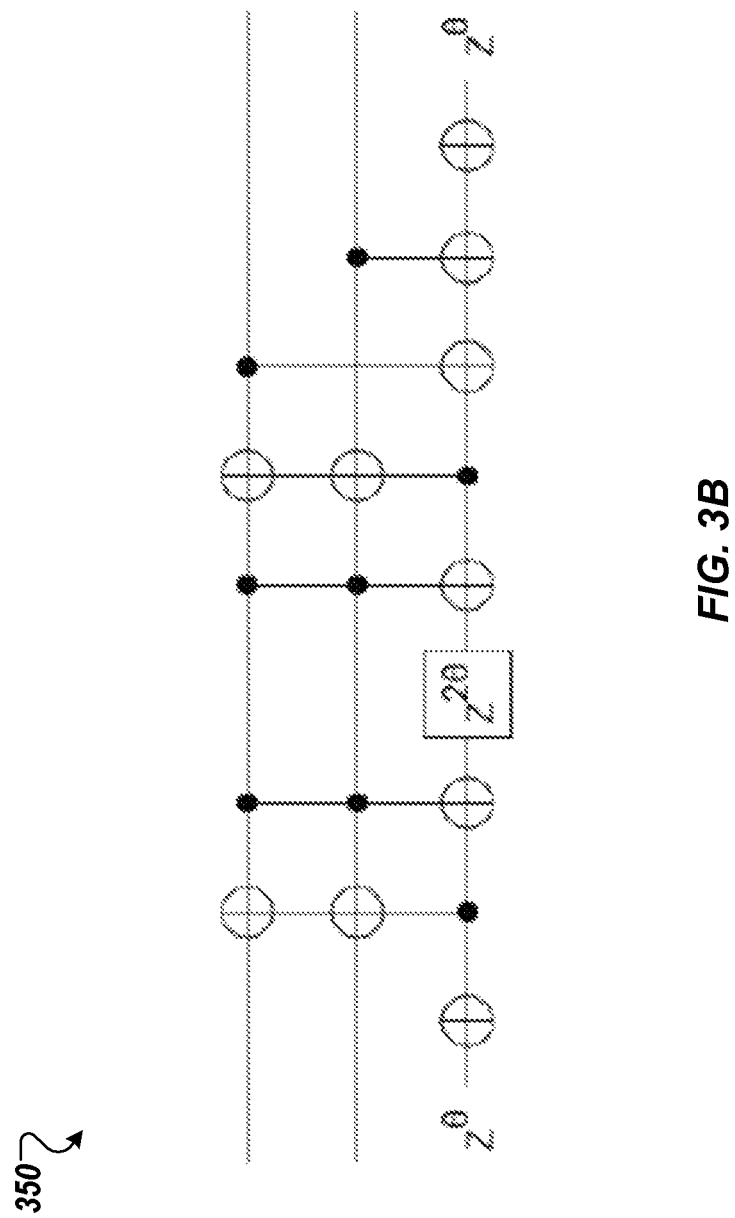
FIG. 3B is a circuit diagram of an alternative quantum circuit for performing a target phase operation on a first and second qubit using a third qubit prepared in a phased plus state.

FIG. 3B is a circuit diagram 350 of an alternative quantum circuit for performing a target phase operation on a first and second qubit using a third qubit prepared in a phased plus state. The alterative quantum circuit shown in FIG. 3B produces output states that are the same as those produced by the quantum circuit shown in FIG. 3A, but does not require an ancilla (fourth) qubit. That is, the alternative quantum circuit includes a sequence of gates that are applied to the three qubits 302a-c. The sequence of gates includes a NOT operation applied to the third qubit, a multi target CNOT gate that is applied to all three qubits, where the third qubit acts as the control, a CNOT gate that is applied to the third qubit where the first and second qubits act as controls, a square phase operation applied to the third qubit, a CNOT operation that is applied to the third qubit where the first and second qubits act as controls, a multi target CNOT gate that is applied to all three qubits, where the third qubit acts as a control, a CNOT gate applied to the first and third qubit, where the first qubit acts as the control, a CNOT gate applied to the second and third qubit where the second qubit acts as the control, and a NOT operation performed on the third qubit.

Figure 4:
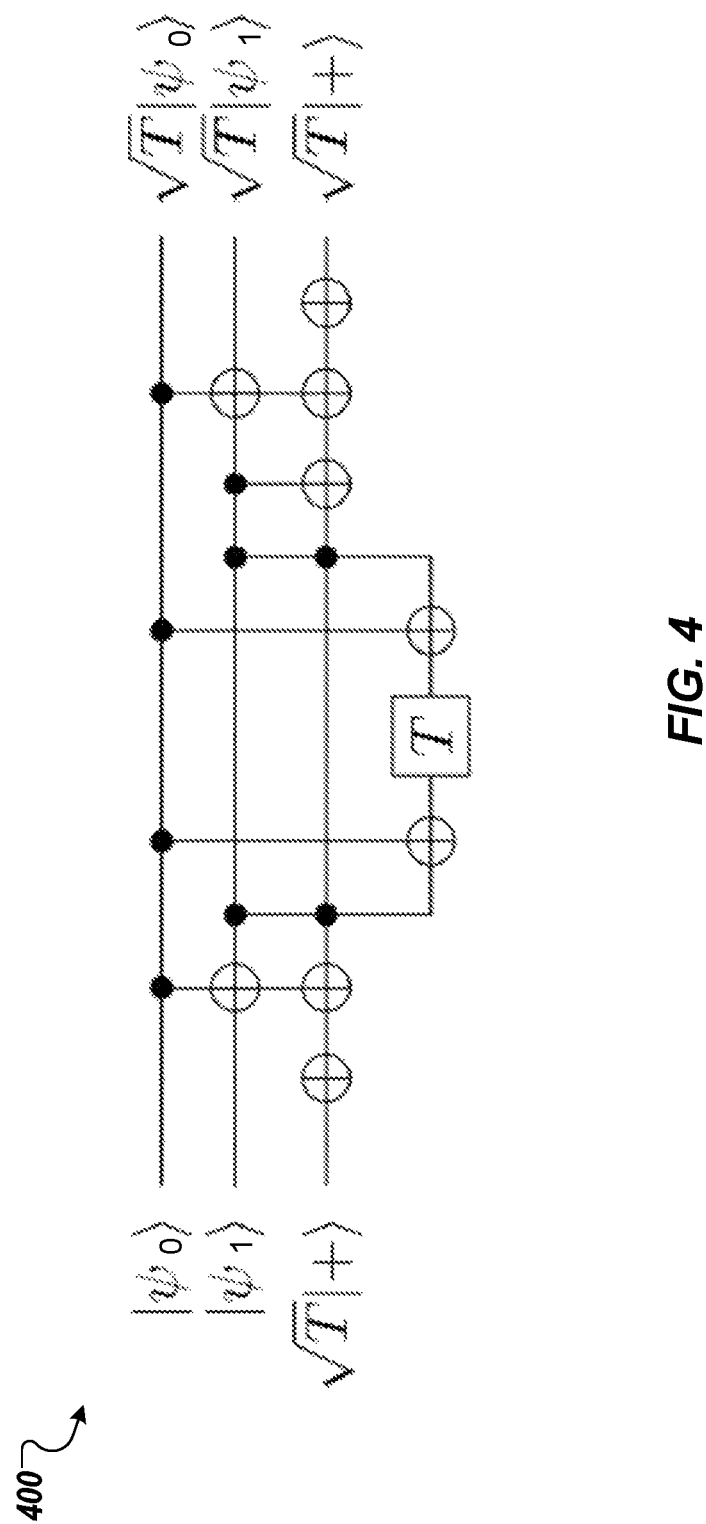
FIG. 4 is a circuit diagram of an example quantum circuit for performing a $\sqrt{T}$ gate on a first and second qubit using a third qubit prepared in a $\sqrt{T}|+\rangle$ state.

The example process 200 may be used to perform a $Z^\theta = Z^{\pi/8} = \sqrt{T}$ gate on both a first qubit prepared in a first input state and a second qubit prepared in a second input state using a third qubit prepared in a $\sqrt{T}|+\rangle$ state. FIG. 4 is a circuit diagram 400 of an example quantum circuit for performing a $\sqrt{T}$ gate on a first qubit prepared in a first input state and a second qubit prepared in a second input state using a third qubit prepared in a $\sqrt{T}|+\rangle$ state. FIG. 4 shows how two $\sqrt{T}$ gates can be performed at a total cost of 5 T gates (four for the adder computations and uncomputations and one for the inner portion of the circuit, e.g., operation 308), or 2.5 T gates per $\sqrt{T}$ operation. Since an initial cost of 50 T gates may be required to prepare a $\sqrt{T}$ state using existing methods (i.e., methods different to those described in this specification), the presently described techniques are an order of magnitude better than existing techniques in terms of cost.

Operating the Hardware: An Example Method for Duplicating Quantum States when Applying Phase Operations The example process 200 described above with reference to FIGS. 2-4 is used to perform an arbitrary target phase operation on both a first qubit prepared in a first input state and a second qubit prepared in a second input state using a third qubit prepared in a phased plus state, where the first input state and second input state can include any arbitrary initial states or states representing an output of a previous computation. The techniques described with reference to FIGS. 2-4 can also be utilized to duplicate quantum states while applying target phase operations.

For example, in settings where a single phase operation $Z^\theta$ is to be performed on the first qubit prepared in an arbitrary first input state, the second qubit may be prepared in a plus state (i.e., the second input state is a plus state) and the third qubit may be prepared in a phased plus state. Application of the example process 200 then maintains the state of the third qubit and duplicates the state of the third qubit by outputting the second qubit in a phased plus state. This duplicated state may then be provided for use in a subsequent quantum computation, e.g., as a resource state in a subsequent application of example process 200 for performing a same target phase operation on a fifth and sixth qubit, as a resource state in a subsequent application of example process 200 for duplicating a quantum state while applying a target phase operation, or as a resource state for performing another phase operation, as described below with reference to FIG. 6.

Figure 5:
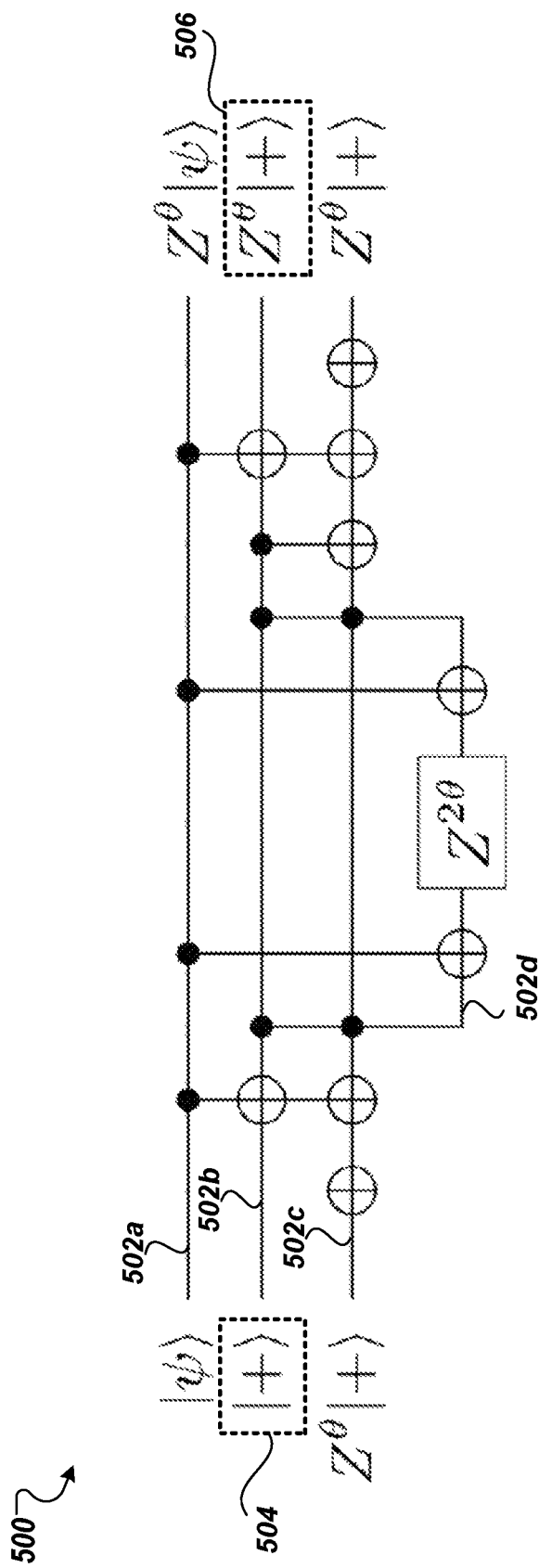
FIG. 5 is a circuit diagram of an example quantum circuit for duplicating a quantum state while performing a target phase operation.

FIG. 5 is a circuit diagram 500 of an example quantum circuit for duplicating a quantum state while performing a target phase operation $Z^\theta$. In the example quantum circuit shown in circuit diagram 500, the first qubit, second qubit and third qubit are represented by horizontal lines 502a-c. Qubit 502a represents the first qubit on which the target phase operation $Z^\theta$ is to be performed. Qubit 502c represents the third qubit whose state $Z^\theta|+\rangle$ is to be duplicated using qubit 502b.

As described above with reference to FIG. 3A, qubit 502a is provided to the example quantum circuit in an arbitrary input state $|\psi\rangle$. For example, the input state $|\psi\rangle$ can be an initially prepared state of the qubit 502a or can be a state representing an output of a previous computation. Qubit 502c is provided to the example quantum circuit in a phased plus state $Z^\theta|+\rangle$. Unlike the example circuit shown in FIG. 3A, qubit 502b is prepared in a plus state $|+\rangle$ 504. That is, the second input state described above with reference to FIGS. 3 and 4 is a plus state.

Operations performed by the example quantum circuit shown in FIG. 5 include a sequence of gates that is similar to that shown and described above with reference to FIG. 3A above. For convenience, a description of this sequence of gates is not repeated.

After the example quantum circuit shown in FIG. 5 has been applied to the three qubits 502a-c (and fourth qubit 502d), the target phase operation $Z^\theta$ has been applied to the first qubit 502a. The target phase operation $Z^\theta$ has also been applied to the second qubit 502b, which results in a phased plus state $Z^\theta|+\rangle$ 506. The quantum state of the third qubit 502c has not been consumed and is also in a phased plus state $Z^\theta|+\rangle$. That is, a second copy 506 of the resource state $Z^\theta|+\rangle$ has been created and passed into the circuit instead of wasting the opportunity for applying a second phase operation and just applying a first phase operation.

Operating the Hardware: An Example Method for Performing Individual $\sqrt{T}$ Gates Using 2.75 T Gates The techniques described with reference to FIGS. 2-5 can also be used to perform individual $(Z^\theta)^{1/2}$ phase operations, e.g., $\sqrt{T}$ gates. Performing a $\sqrt{T}$ gate using the above described techniques may include applying the circuit described above with reference to FIG. 5 with $Z^\theta = \sqrt{T}$ to three qubits—a first qubit prepared in an arbitrary first input state $|\psi\rangle$, a second qubit prepared in a plus state and a third qubit prepared in a phased plus state—to put the first qubit in a $\sqrt{T}|\psi\rangle$ state, the second qubit in a phased plus state $\sqrt{T}|+\rangle$ and the third qubit in the same phased plus state $\sqrt{T}|+\rangle$.

The third qubit in the $\sqrt{T}|+\rangle$ is a resource state and may be reused to perform subsequent gate teleportation operations, e.g., operations based on example process 200. The second qubit in the $\sqrt{T}|+\rangle$ state may be used to generate a $\sqrt{T}|\psi\rangle$ through application of a subsequent circuit. Application of the subsequent circuit may include applying a CNOT operation between the second qubit that is now in a phased plus state and a fifth qubit prepared in an arbitrary input state, where the fifth qubit acts as a control for the CNOT operation. The second qubit may then be measured, and a squared phase operation (T operation/gate) may be performed on the fifth qubit if a generated measurement result from measuring the second qubit indicates that the second qubit is ON.

Figure 6:
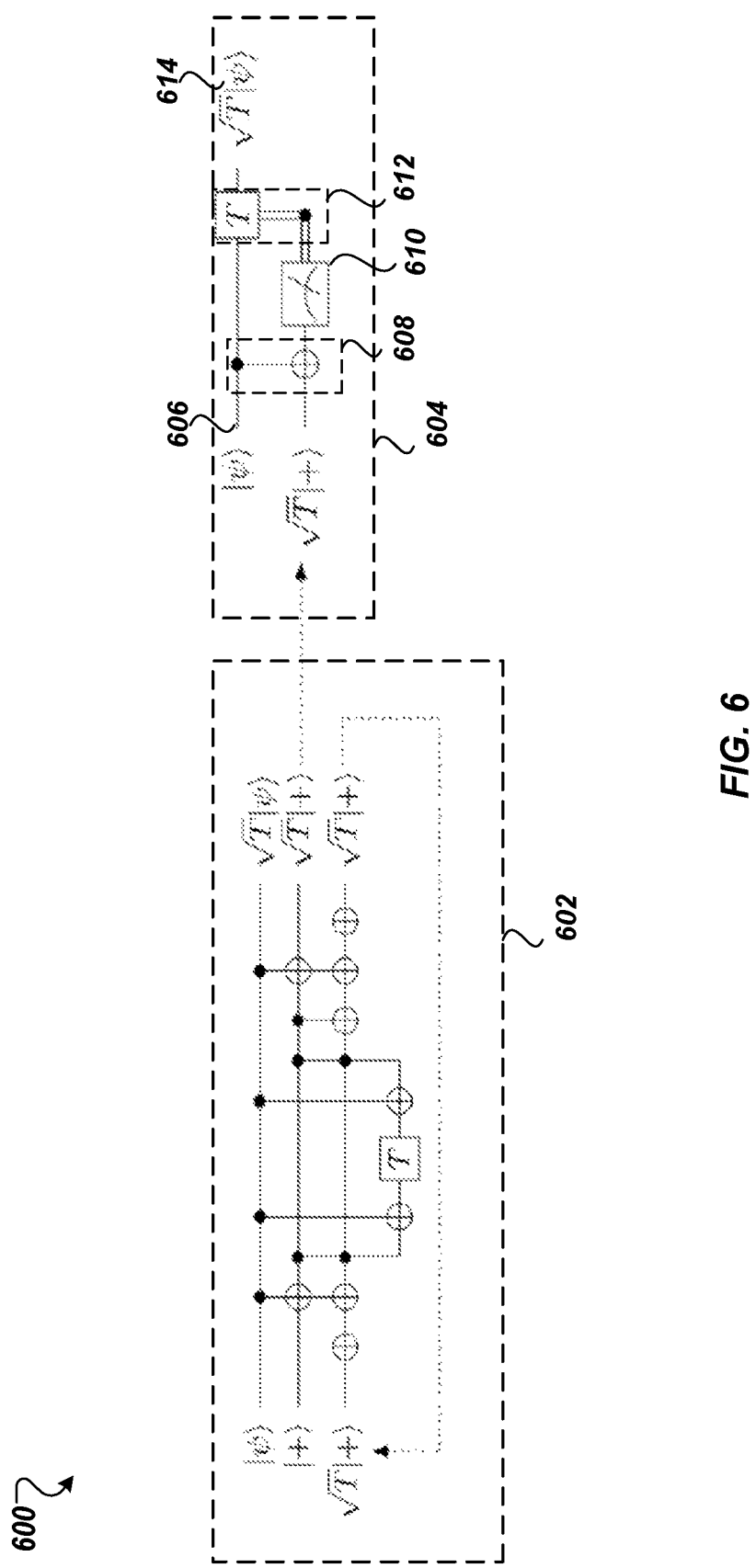
FIG. 6 is a circuit diagram of an example quantum circuit for performing individual $\sqrt{T}$ gates.

FIG. 6 is a circuit diagram 600 of an example quantum circuit for performing individual $\sqrt{T}$ gates. The example quantum circuit shown in FIG. 6 includes two sub-circuits 602 and 604. Sub-circuit 602 is the same as the example quantum circuit shown in FIG. 5 with $Z^\theta = \sqrt{T}$, and for convenience is therefore not described again. Sub-circuit 604 operates on two qubits—a fifth qubit 606 prepared in an arbitrary input state $|\psi\rangle$ and the second qubit from sub-circuit 604 which is provided to the sub-circuit 604 in a phased plus state $\sqrt{T}|+\rangle$.

The sub-circuit 604 includes a sequence of gates that may provide a phased input state $\sqrt{T}|\psi\rangle$ 614. The sequence of gates includes a CNOT operation 608 between the fifth qubit 606 and the second qubit in the phased plus state, a measurement operation 610 that is applied to the second qubit and generates a respective measurement result, and a controlled phase operation 612 that applies a phase operation (a fix up operation) to the fifth qubit if the generated measurement result from operation 610 indicates that the second qubit is ON. Due to quantum superposition, there is a 50% chance that the fixup operation will be performed. Therefore, the cost of performing the $\sqrt{T}$ operation when consuming the $\sqrt{T}|+\rangle$ state is 0.5 on average. By alternating between producing the extra state $\sqrt{T}|+\rangle$ and consuming the extra state $\sqrt{T}|+\rangle$, any number of unpaired $\sqrt{T}$ operations can be performed with an average cost of $(5+0.5)/2=2.75$ T gates.

It is noted that the costs for performing the $\sqrt{T}$ operation do not scale up with the amount of desired precision. Only the cost of producing the initial $\sqrt{T}$ state scales with the desired precision. But these setup costs are only paid once, and so can be amortized over the cost of every $\sqrt{T}$ operation performed.

Operating the Hardware: An Example Method for Performing Individual $\sqrt{\sqrt{T}}$ Gates Using 4.07 T Gates The techniques described above with reference to FIGS. 2-6 can be combined to provide an example method for performing individual $(Z^\theta)^{1/4}$ phase operations, e.g., $\sqrt{\sqrt{T}}$ gates.

Figure 7:
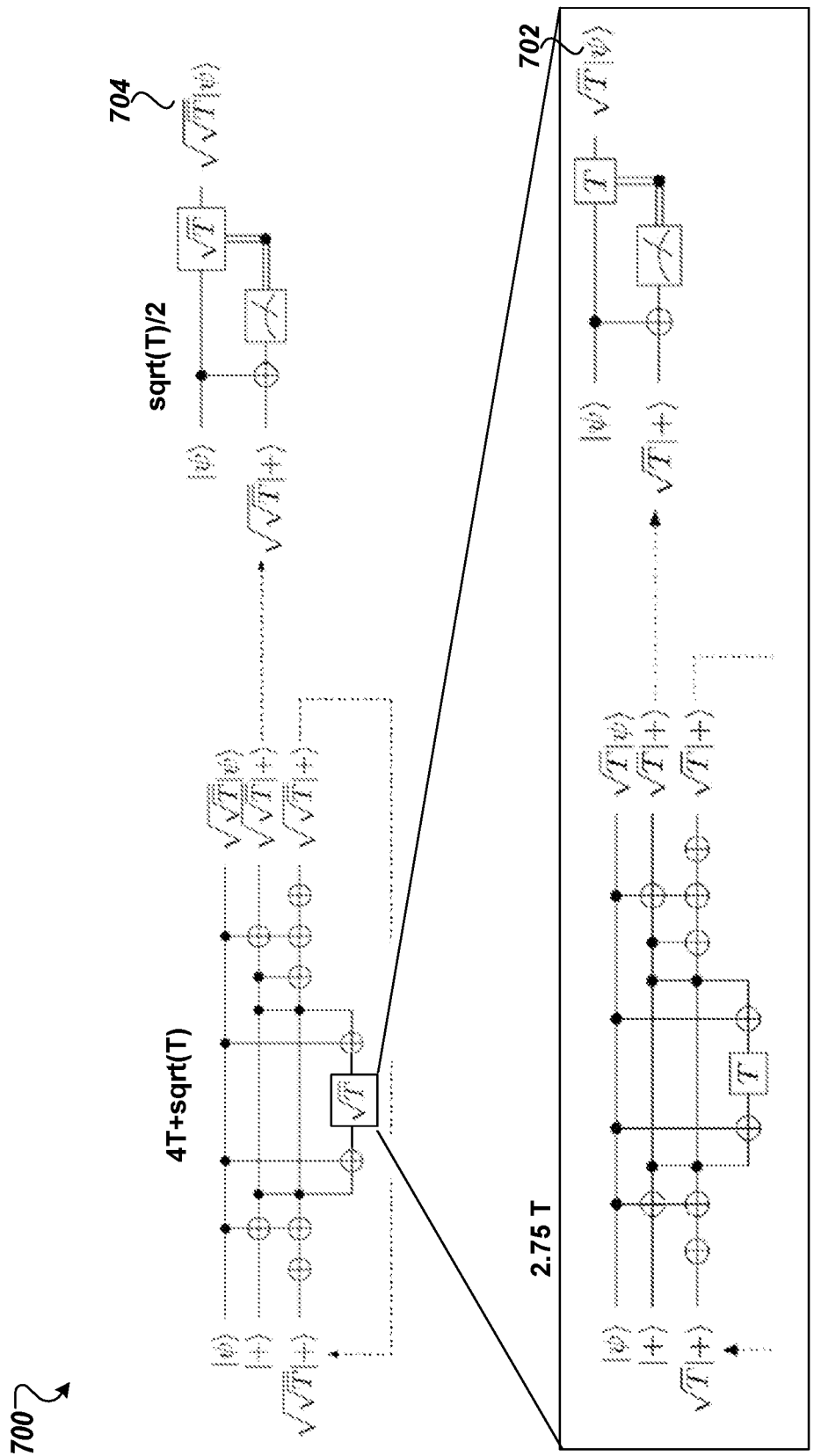
FIG. 7 is a circuit diagram of an example quantum circuit for performing $\sqrt{\sqrt{T}}$ gates.

FIG. 7 is a circuit diagram 700 of an example quantum circuit for performing $\sqrt{\sqrt{T}}$ operations. In this case, both a $\sqrt{T}$ state 702 and a $\sqrt{\sqrt{T}}$ state 704 are provided as output from the example quantum circuit. $\sqrt{\sqrt{T}}$ states are alternatively produced and consumed when performing lonely $\sqrt{\sqrt{T}}$ operations, and in this case a $\sqrt{T}$ inner phasing operation is performed. The T-count of the $\sqrt{\sqrt{T}}$ construction shown in FIG. 7 is therefore $$2 + \frac{3}{4}(\text{cost of } \sqrt{T}) = 2 + \frac{3}{4}(2.75) \approx 4.07.$$

In general, performing the 2^k'th root of a T operation has a cost that satisfies the recurrence relation R(k)=1, R(k)=2+¾*R(k) and is limited by an upper bound of 8, no matter how fine the angle or the desired precision.

Three-quarters of the time, the above described phasing construction requires a second phasing operation with twice the angle of the target phasing operation to be performed. The second phasing operation may be performed using the same techniques. However, then the second phasing operation may also produce a third phasing operation by four times the angle of the original phasing operation. As long as the necessary states are prepared, this recursion can be continued as long as desired. (Although in practice, it may be terminated after a number of iterations determined by space-vs-time tradeoffs—more iterations saves more T gates, but more iterations requires more space.)

Operating the Hardware: An Example Iterative Method for Performing a T Gate

Figure 8:
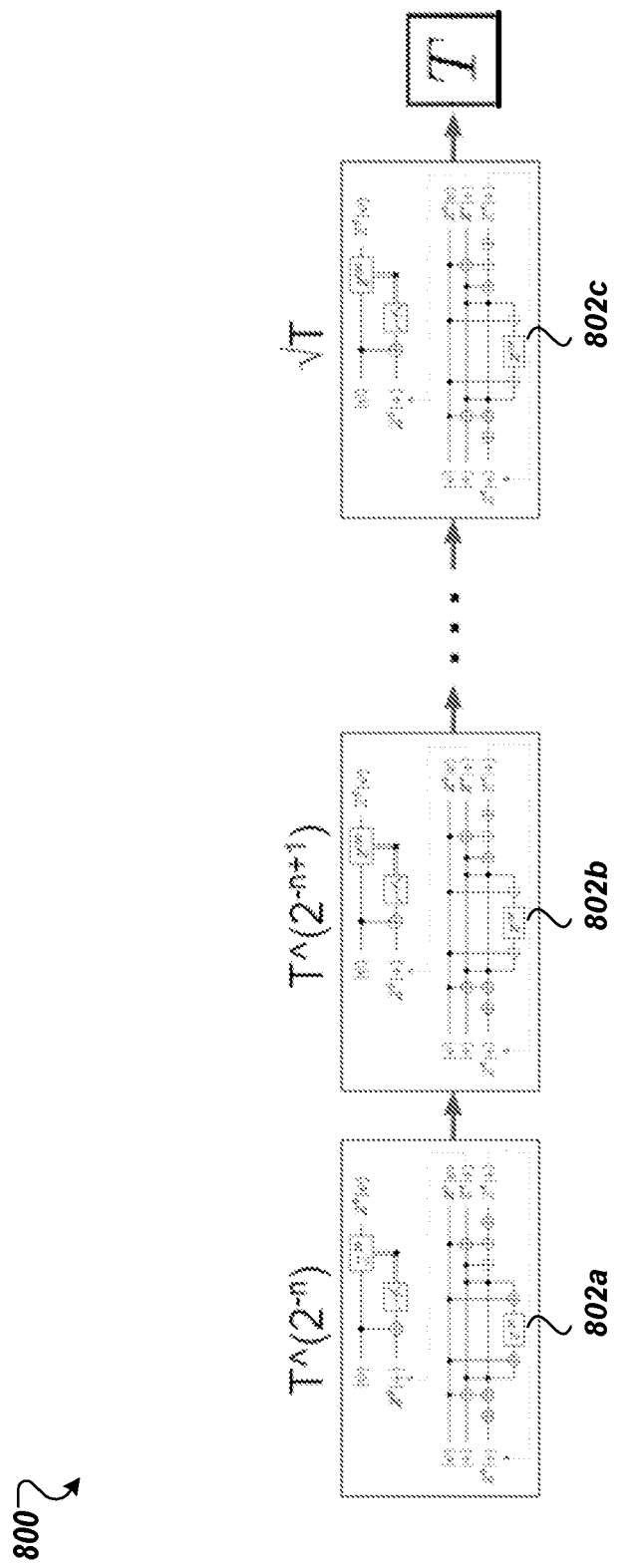
FIG. 8 is a circuit diagram of an example iterative construction for performing a target phase operation.

The techniques described above with reference to FIG. 7 can be iterated to provide an example method that uses a ladder of phase operations to perform a target phase operation. For example, FIG. 8 is a circuit diagram of an example quantum circuit ladder construction 800 for iteratively performing $(Z^\theta)^{2^{-n}}$ gates until a $Z^\theta$ gate is performed. The example ladder construction 800 is shown as performing a T gate, but this is for convenience only and other phase operations may be performed.

As shown in FIGS. 2-8, the phasing operation to be performed delegates to an inner phasing operation, e.g., operation 308 of FIG. 3A and operations 802a-c of FIG. 8, that phases by twice as much. When the starting point is an angle that becomes a multiple of 45 degrees after a reasonable number of multiplications by 2, this process can be terminated with a T gate. A different approach is needed for angles with odd periods such as 120 degrees, angles that are irrational multiples of 45 degrees such as 1 radian, or angles that are so small that it would be unnecessarily costly to prepare all the necessary resource states reaching from the target angle all the way to the T gate. In these cases, a resource state can be prepared for the desired angle, twice the desired angle, four times the desired angle, etc. up to some finite length. In order to achieve a constant number of T gates, this length should scale asymptotically as 1 g(1 g(1/epsilon)). In some cases, e.g., for practical purposes, the chain may have a length less than 25. The phasing operation is then performed just as it would be for angles that terminate on a T gate, except when "the top of the chain is passed" an operation is applied "the hard way" with existing techniques. This changes the recurrence relation describing the cost from R(k)=1, R(k)=2+¾*R(k) to R(k)=1.15*1 g(1/epsilon), R(k)=2+¾*R(k). Solving this recurrence relation and solving for length k for which R(k)<=10 shows the 1 g(1 g(1/epsilon)) scaling.

Figure 9:
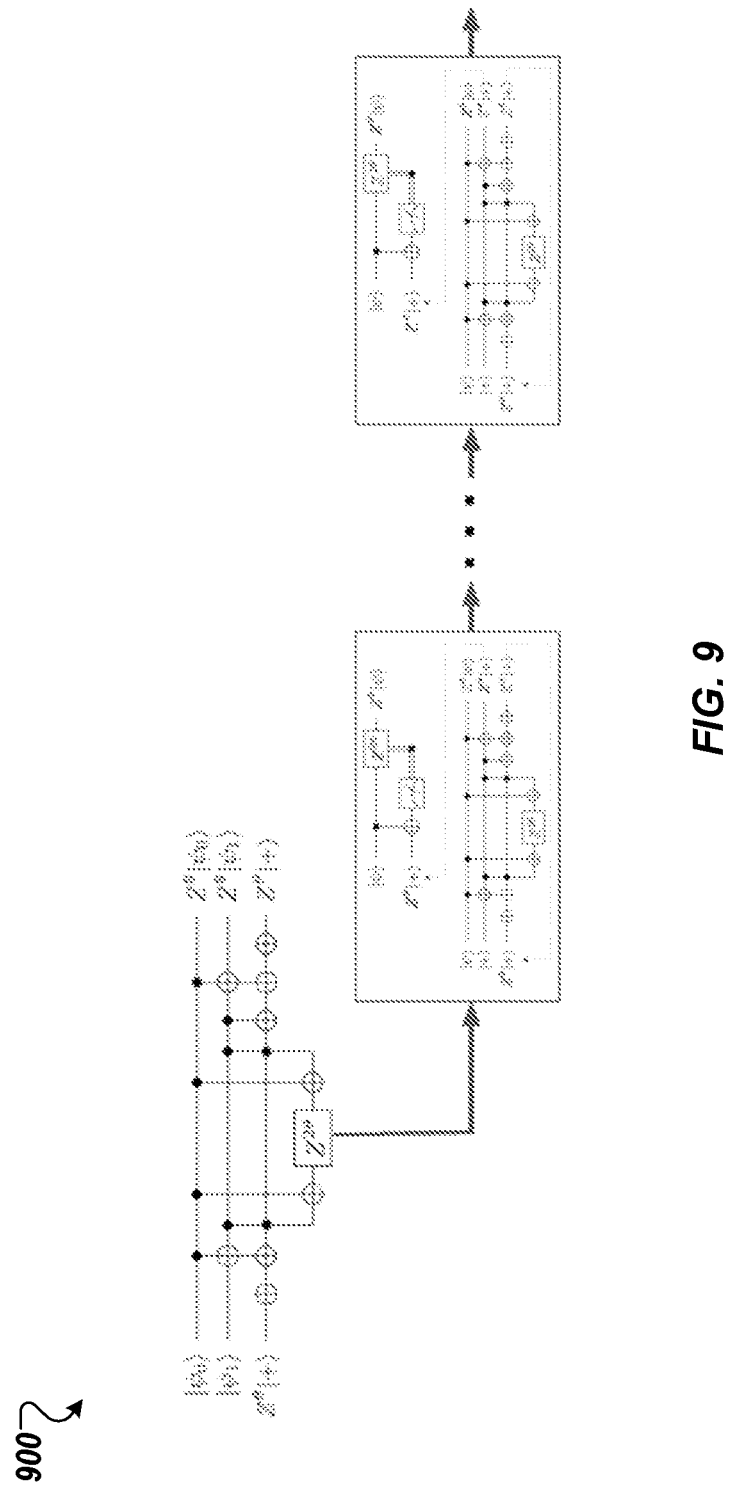
FIG. 9 shows a first circuit diagram of an example quantum circuit construction for amortizing gate costs over pairs of operations.
Figure 10:
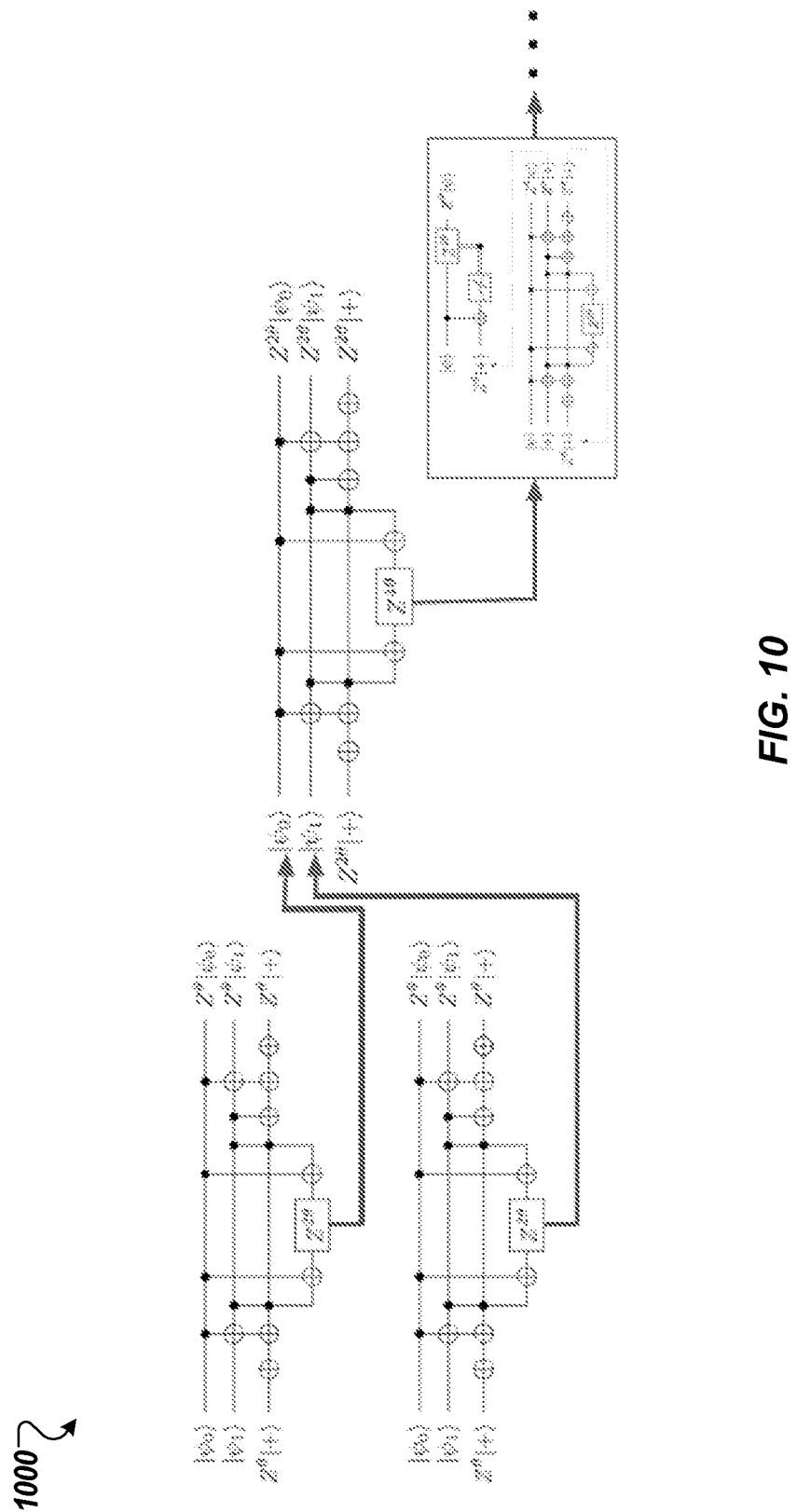
FIG. 10 shows a second circuit diagram of an example quantum circuit construction for amortizing gate costs over groups of four operations.

Once a chain of states has been prepared for a given angle, it can be used as much as possible before discarding. One particularly beneficial situation is when 2 or 4 operations need to be performed at the same time. For example, when there are two operations to perform, it is not necessary to produce an extra state or to consume an extra state. The example process 200 can be applied directly. This will cause a phasing operation of angle 2θ to occur, but the cost of this underlying operation (and the adder) will be amortized over two desired operations instead of one. So instead of P[n] costing 2+¾R[n−1] as R[n] does, it costs (4+R[n−1])/2=2+½R[n−1]. A saving of ¼R[n−1] is achieved. Since R[k] converges to 8 for not-too-large k, this implies a saving of nearly ~2 T gates. Furthermore, if $\theta^{2^k}$ happens to be a multiple of 45 degrees, then the process can be immediately terminated at the k-th level by applying a single T gate. FIG. 9 shows a first circuit diagram 900 of an example quantum circuit construction for amortizing gate costs over pairs of operations. FIG. 10 shows a second circuit diagram 1000 of an example quantum circuit construction for amortizing gate costs over groups of 4 operations. Amortizing ladder climbing costs in this manner reduces the maximum average T-count from ~8 to ~6 or ~5 respectively, because the apply-two-phasings-without-consuming-the-resource-state circuit can be used to its full potential, instead of having to alternate it with the circuit that consumes states.

Figure 11:
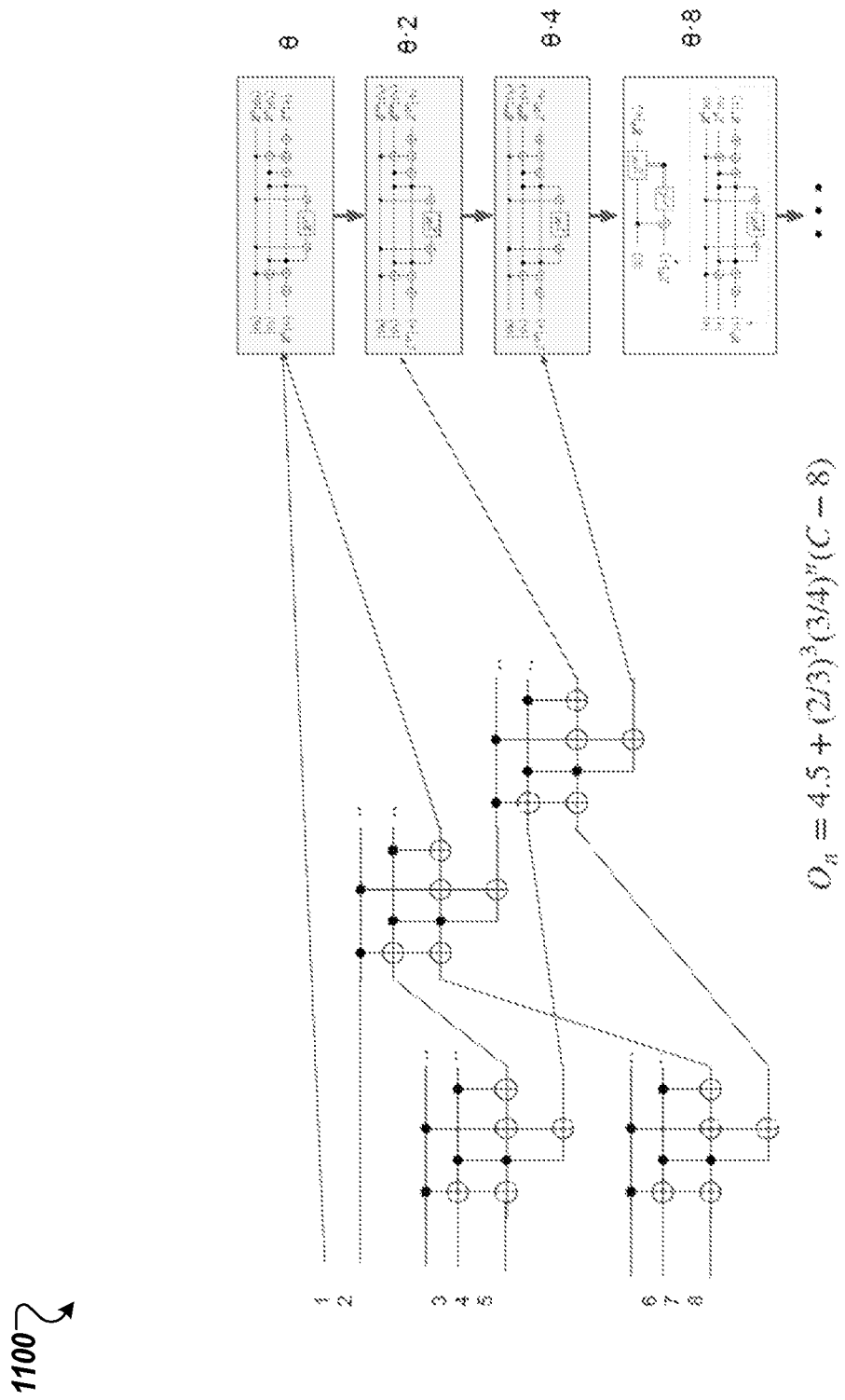
FIG. 11 shows how keeping extra states may be avoided by Hamming weight phasing.

Keeping extra states may be avoided through computing Hamming weights, as illustrated in FIG. 11. FIG. 11 shows how interpolating further from iterative application of gates and closer to parallel application of gates causes expected costs to decrease. This is because the raw Hamming weight phasing technique is even more efficient than the iterative ladder based technique.

Implementations of the digital and/or quantum subject matter and the digital functional operations and quantum operations described in this specification can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum processors or both, or any other kind of central digital and/or quantum processing unit. Generally, a central digital and/or quantum processing unit will receive instructions and digital and/or quantum data from a read-only memory, a random access memory, or quantum systems suitable for transmitting quantum data, e.g. photons, or combinations thereof.

The essential elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method, performed by a quantum computing device, for applying a target phase to a first qubit and a second qubit by performing a phase operation on a first and second qubit using a third qubit prepared in a phased plus state, wherein the phased plus state comprises a plus state that has been phased by an angle equivalent to the target phase, comprising:
    performing a first NOT operation on the third qubit;
    performing a first multi target CNOT gate on the first, second and third qubits, wherein the first and second qubits comprise target qubits and the third qubit acts as a control;
    performing a first CNOT gate on the third qubit, wherein the first and second qubits act as controls;
    performing a square phase operation on the third qubit,
    performing a second CNOT operation on the third qubit, wherein the first and second qubits act as controls;
    performing a second multi target CNOT gate on the first, second and third qubits, wherein the first and second qubits comprise target qubits and the third qubit acts as a control;
    performing a third CNOT gate on the third qubit, wherein the first qubit acts as a control;
    performing a fourth CNOT gate on the third qubit, wherein the second qubit acts as the control; and
    performing a second NOT operation on the third qubit.

2. The method of claim 1, wherein performing the second NOT operation on the third qubit returns the third qubit to the phased plus state.

3. The method of claim 1, wherein the first and second qubits are initially prepared in arbitrary initial states.

4. The method of claim 1, wherein:
    the first qubit is prepared in an arbitrary initial state, the second qubit is prepared in a plus state, and the third qubit is prepared in a phased plus state; and
    after performing the second NOT operation on the third qubit, the second qubit is in a phased plus state, the third qubit is in a phased plus state, and the phase operation has been performed on the first qubit.

5. The method of claim 4, further comprising providing the second qubit in the phased plus state for use in a gate teleportation operation.

6. The method of claim 5, wherein the gate teleportation operation comprises one of:
    performing a second phase operation on a fifth and sixth qubits;
    preparing a sixth qubit in a same state as a seventh qubit when performing a phase operation on a fifth qubit; or
    performing the phase operation on a fifth qubit.

7. The method of claim 6, wherein performing the phase operation on a fifth qubit comprises:
    applying a CNOT operation between the second qubit prepared in the phased plus state and the fifth qubit prepared in an arbitrary state, wherein the fifth qubit acts as the control;
    measuring the second qubit; and
    applying a squared phase operation to the fifth qubit if a generated measurement result from measuring the second qubit indicates that the second qubit is ON.

8. The method of claim 4, wherein performing the square phase operation on the third qubit comprises preparing a sixth qubit in a same state as a seventh qubit when performing the square phase operation on a fifth qubit.

9. The method of claim 8, further comprising iteratively performing squares of the phase operation.

10. The method of claim 1, wherein the phase operation comprises a single qubit operation of the form $$Z^\theta = \begin{pmatrix} 1 & 0 \\ 0 & e^{i\pi\theta} \end{pmatrix}$$

where $\theta$ specifies the phase operation, and wherein the square of the phase operation is given by $Z^{2\theta}$.

11. The method of claim 1, wherein the phased plus state comprises the phase operation applied to a plus state ⊢|+⟩ =(|0⟩ +|1⟩ )/√2, and/or wherein the phase operation comprises a $$\sqrt{T} = Z^{\frac{\pi}{8}}$$

operation.

12. The method of claim 1, further comprising, for a system requiring N phase operations to be performed on multiple respective qubits:
   grouping qubits that require a phase operation into O(sqrt (N)) groups of size O(sqrt(N));
   preparing a full-total qubit register of size O(log(N));
   for each group:
      computing a Hamming weight of the qubits in the group;
      adding a computed group-total into the full-total register;
      uncompute the Hamming weight of the qubits in the group;
   performing phase operations on the full-total register;
   for each group:
      computing a Hamming weight of the qubits in the group;
      subtracting a computed group-total out of the full-total register; and
      uncomputing the Hamming weight of the qubits in the group,
   optionally further comprising clearing and discarding the full-total register.

13. An apparatus (100) comprising quantum hardware (102) in data communication with one or more classical processors (104), wherein the quantum hardware is configured to perform operations for applying a target phase to a first qubit and a second qubit by performing a phase operation on a first and second qubit using a third qubit prepared in a phased plus state, wherein the phased plus state comprises a plus state that has been phased by an angle equivalent to the target phase, the operations comprising:
   performing a first NOT operation on the third qubit;
   performing a first multi target CNOT gate on the first, second and third qubits, wherein the first and second qubits comprise target qubits and the third qubit acts as a control;
   performing a first CNOT gate on the third qubit, wherein the first and second qubits act as controls;
   performing a square phase operation on the third qubit,
   performing a second CNOT operation on the third qubit, wherein the first and second qubits act as controls;
   performing a second multi target CNOT gate on the first, second and third qubits, wherein the first and second qubits comprise target qubits and the third qubit acts as a control;
   performing a third CNOT gate on the third qubit, wherein the first qubit acts as a control;
   performing a fourth CNOT gate on the third qubit, wherein the second qubit acts as the control; and
   performing a second NOT operation on the third qubit.

14. The apparatus of claim 13, wherein the quantum hardware comprises:
   a register of qubits;
   a plurality of control lines coupled to the register of qubits; and
   a plurality of control circuits coupled to the plurality of control lines.

15. The apparatus of claim 13, wherein:
   the first qubit is prepared in an arbitrary initial state, the second qubit is prepared in a plus state, and the third qubit is prepared in a phased plus state; and
   after performing the second NOT operation on the third qubit, the second qubit is in a phased plus state, the third qubit is in a phased plus state, and the phase operation has been performed on the first qubit.

16. The apparatus of claim 15, further comprising providing the second qubit in the phased plus state for use in a gate teleportation operation.

17. The apparatus of claim 13, wherein performing the second NOT operation on the third qubit returns the third qubit to the phased plus state.

18. The apparatus of claim 13, wherein the first and second qubits are initially prepared in arbitrary initial states.

19. The apparatus of claim 13, wherein the phase operation comprises a single qubit operation of the form $$Z^\theta = \begin{pmatrix} 1 & 0 \\ 0 & e^{i\pi\theta} \end{pmatrix}$$

where θ specifies the phase operation, and wherein the square of the phase operation is given by $Z^{2\theta}$.

20. The apparatus of claim 13, wherein the phased plus state comprises the phase operation applied to a plus state ⊢|+⟩ =(|0⟩ +|1⟩ )/√2, and/or wherein the phase operation comprises a $$\sqrt{T} = Z^{\frac{\pi}{8}}$$

operation.

* * * * *